(12) United States Patent
Korthuis

(10) Patent No.: US 8,049,110 B2
(45) Date of Patent: Nov. 1, 2011

(54) MICROELECTRONIC DEVICE

(75) Inventor: Vincent C. Korthuis, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 619 days.

(21) Appl. No.: 12/286,626

(22) Filed: Oct. 1, 2008

(65) Prior Publication Data

US 2010/0078210 A1    Apr. 1, 2010

(51) Int. Cl.
*H05K 1/02* (2006.01)
*H05K 3/00* (2006.01)

(52) U.S. Cl. .......... 174/250; 174/255; 174/261; 29/825; 29/829; 29/846

(58) Field of Classification Search .............. 174/250, 174/255, 261, 262; 29/825, 829, 846
See application file for complete search history.

(56) References Cited

U.S. PATENT DOCUMENTS

| | | | |
|---|---|---|---|
| 5,002,367 A | 3/1991 | Nicholas | |
| 6,400,030 B1 | 6/2002 | Wang | |
| 6,521,475 B1 | 2/2003 | Chen | |
| 7,071,097 B2 | 7/2006 | Colburn | |
| 7,653,990 B2 * | 2/2010 | Lee et al. | 29/846 |
| 2005/0170639 A1 | 8/2005 | Mei | |
| 2006/0006546 A1 | 1/2006 | Colburn | |
| 2007/0210425 A1 | 9/2007 | Ramakrishna | |
| 2008/0012168 A1 * | 1/2008 | Ra et al. | 264/104 |
| 2008/0034581 A1 * | 2/2008 | Ra et al. | 29/834 |

FOREIGN PATENT DOCUMENTS

| | | | |
|---|---|---|---|
| JP | 2000124581 A | * | 4/2000 |
| JP | 2001196703 A | * | 7/2001 |

* cited by examiner

*Primary Examiner* — Robert J Hoffberg

(57) ABSTRACT

A method of manufacturing a microelectronic device including imprinting a layer on a substrate with an imprinted pattern, the imprinted pattern defining a first anchor impression within the layer that includes a first base region positioned adjacent the layer and a first distal region positioned opposite the first base region, the first distal region defining a cross sectional area greater than a cross sectional area of the first base region, and the imprinted pattern defining a second anchor impression within the layer that includes a second base region positioned adjacent the layer and a second distal region positioned opposite the second base region, the second distal region defining a cross sectional area greater than a cross sectional area of the second base region and greater than a cross sectional area of the first distal region.

18 Claims, 8 Drawing Sheets

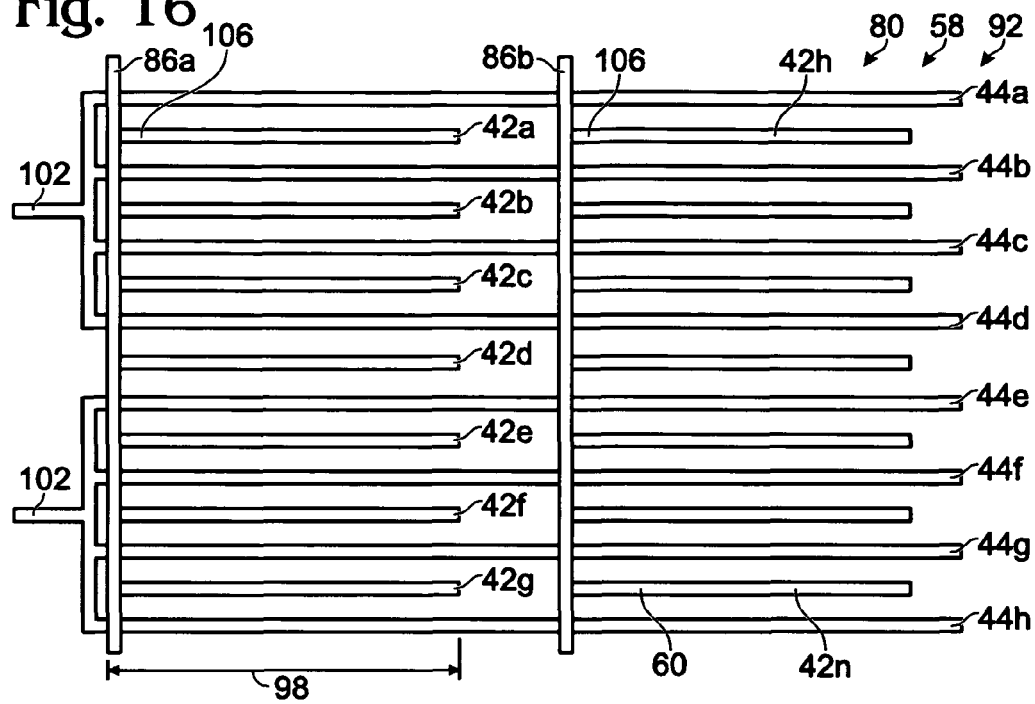
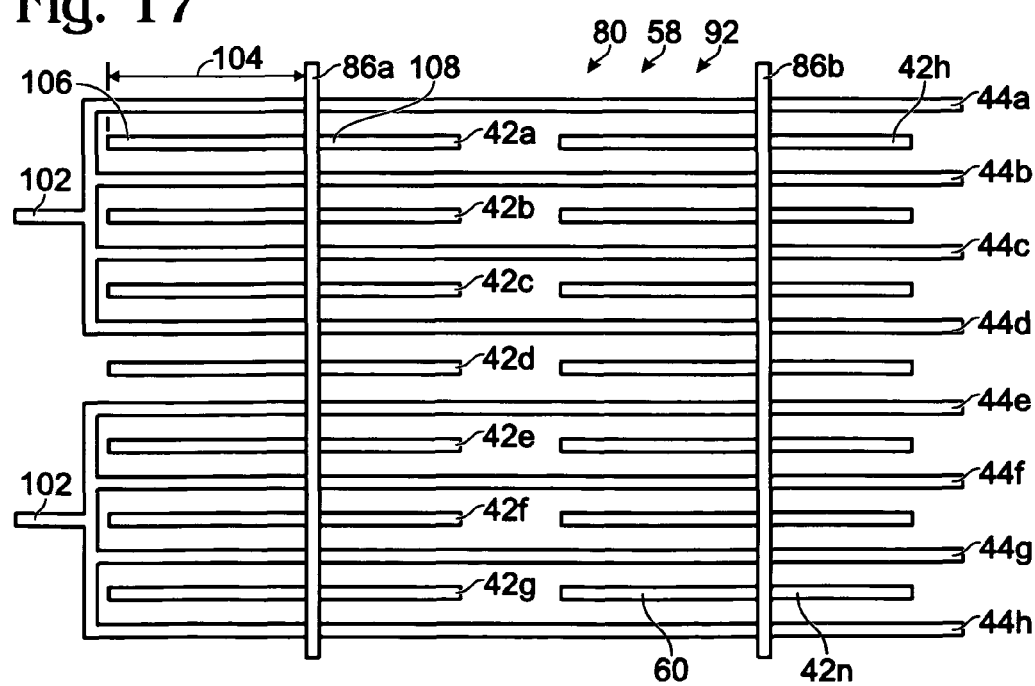

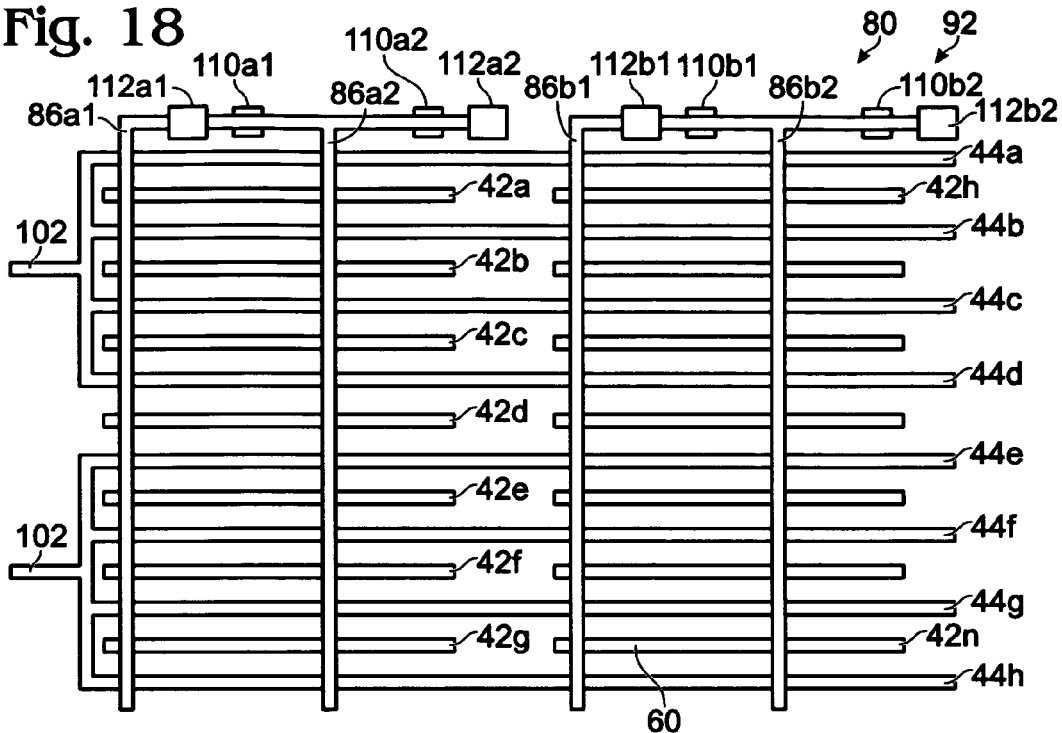
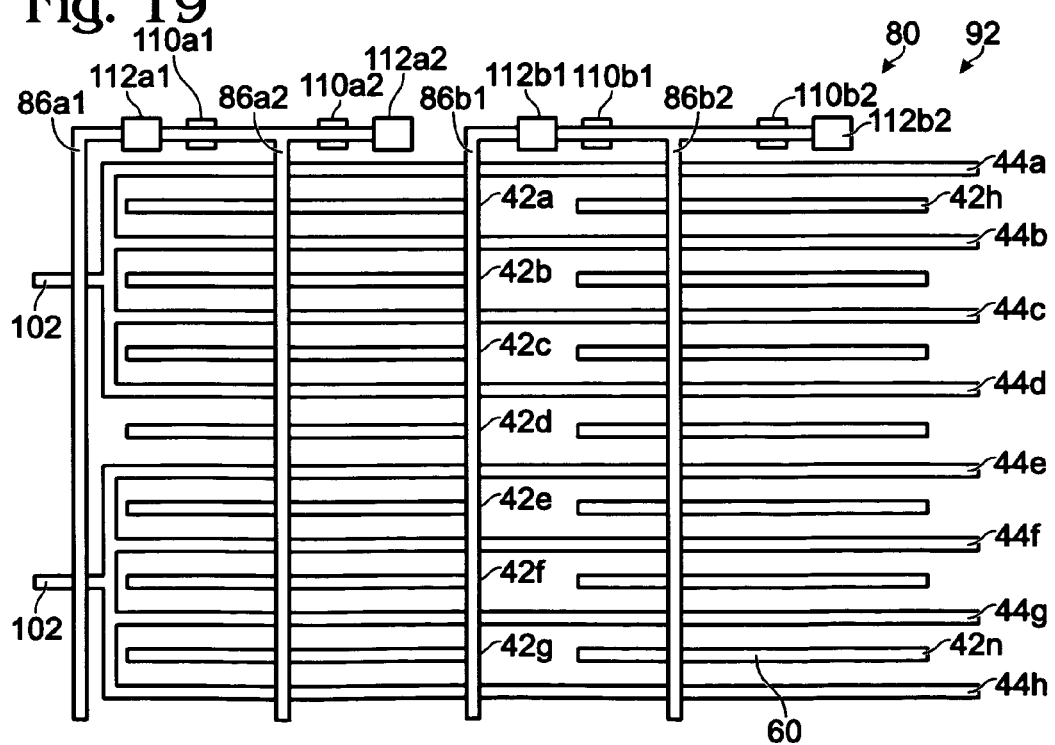

MICROELECTRONIC DEVICE

BACKGROUND

Imaging devices, such as charged ink pixel containing display devices, may be fabricated by forming a microelectronic device including plating first and second electrical conductors on a substrate and then removing the substrate to expose the conductors. Fabrication of the microelectronic device may be time consuming due to the precise alignment of crossover metal connectors to one of the first or second electrical conductors. There is a need, therefore, to increase the reliability of alignment of the crossover metal connectors to one of the first or second electrical conductors. There is also a need to decrease damage to the conductors during removal of the substrate from the device.

BRIEF DESCRIPTION OF THE DRAWINGS

FIG. 16 is a schematic top view of one example embodiment of a via pattern on the substrate of FIG. 15 with crossover metal lines formed thereon.

FIG. 17 is a schematic top view of another example embodiment of a via pattern on the substrate of FIG. 15 with crossover metal lines formed thereon.

FIG. 18 is a schematic top view of another example embodiment of a via pattern on the substrate of FIG. 15 with aligned crossover metal lines and fuses formed thereon.

FIG. 19 is a schematic top view of another example embodiment of a via pattern on the substrate of FIG. 15 with misaligned crossover metal lines and fuses formed thereon.

DETAILED DESCRIPTION OF THE DRAWINGS

Figure 1:
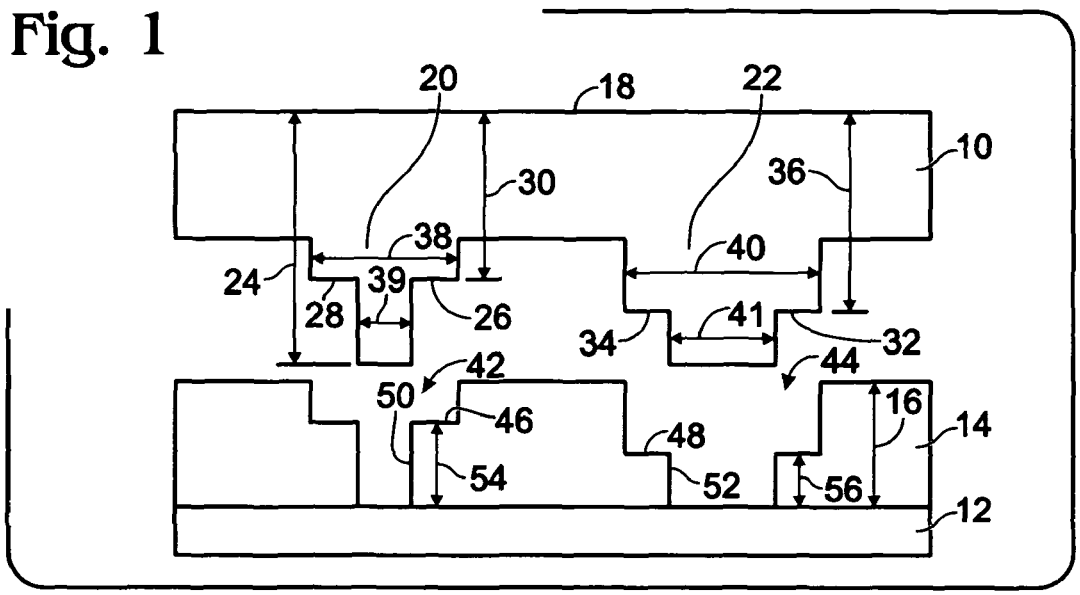
FIG. 1 is a schematic side cross-sectional view of one example embodiment of an embossing stamp positioned over and imprinting a layer on a substrate.

FIG. 1 is a schematic side cross-sectional view of one example embodiment of an embossing stamp 10 positioned over and imprinting a layer on a substrate 12. In the embodiment shown, substrate 12 may be manufactured of stainless steel, nickel or another metal substrate but in other embodiments, substrate 12 may be manufactured of PET (Polyethylene terephthalate), PEN (Polyethylene Naphthalate), and the like. A layer 14 may be formed on substrate 12 such that embossing stamp 10 imprints an impression within layer 14 when stamp 10 and layer 14 are pressed together by relative motion of the stamp, the substrate or both. In the embodiment shown, layer 14 may be a dielectric layer formed on substrate 12 to a thickness 16. Embossing stamp 10 may include a back plane 18, shown in end view, and may include first and second embossing structures 20 and 22 that extend outwardly a first distance 24 from plane 18. In other embodiments, first and second structures 20 and 22 may each extend outwardly from plane 18 a unique distance such that each of the structures 20 and 22 are different heights when measured with respect to plane 18.

First embossing structure 20 may further include an anchor structure 26, such as a stop surface, 28, that may extend outwardly from plane 18 a second distance 30. Second embossing structure 22 may further include an anchor structure 32, such as a stop surface 34, that may extend outwardly from plane 18 a third distance 36 that may be different from second distance 30. Stop surface 28 of first embossing structure 20 may define a cross sectional dimension 38 that is different, such as greater, than a cross sectional dimension 40 of stop surface 34.

Additionally, first embossing structure 20 may define a cross sectional dimension 39 in a lower region that is less than the cross sectional dimension 38 in an upper region of first embossing structure 20. Similarly, second embossing structure 22 may define a cross sectional dimension 41 in a lower region that is less than the cross sectional dimension 40 in an upper region of second embossing structure 22. The upper regions of the embossing structures that define dimensions 38 and 40, respectively, that are greater than the dimensions 39 and 41, respectively, of the lower regions of embossing structures 20 and 22, define the anchor structures in this embodiment.

In another embodiment, the embossing structures may each define a tapered cone that embosses a tapered cone impression within dielectric material 14, wherein each of the tapered cone impressions 42 and 44 may define cross-sectional surface areas the same or different from one another. The increasing diameter and corresponding cross-sectional surface area of the tapered cone formed within dielectric material 14, as measured upwardly from substrate 12, forms an inclined shoulder region that defines another embodiment of an anchor structure of the present invention.

Due to the difference between second and third distances 30 and 36, when stamp 10 is impressed within dielectric layer 14, impressions 42 and 44 will be formed within dielectric layer 14 by first and second anchor structures 20 and 22, wherein the respective stop surfaces 46 and 48 of anchor structures 50 and 52 of impressions 42 and 44 formed in layer 14, will be positioned at first height 54 and a second height 56, respectively, from substrate 12. This difference in heights 54 and 56 of the stop surfaces 46 and 48 of the impressions 42 and 44, allows for filling of the impressions 42 and 44 in a single process, i.e., metal may be plated in both impressions at the same time, to form electrically conductive structures at different heights within layer 14, and resulting in device advantages, as will be discussed in more detail below. In other embodiments, stop surfaces 46 and 48 may be sloped or curved with respect to plane 18.

Figure 2:
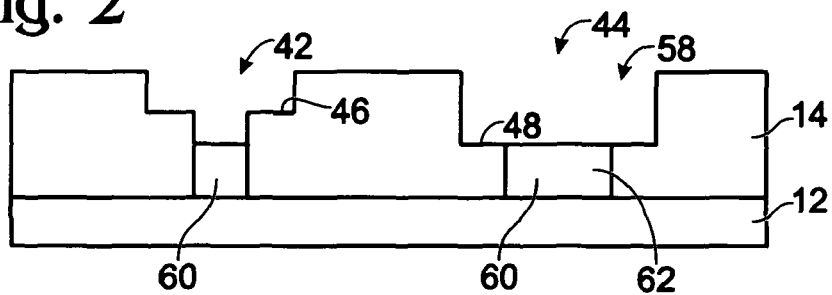
FIG. 2 is a schematic side cross-sectional view of one example embodiment of filling a portion of the imprinted pattern on the substrate of FIG. 1.

FIG. 2 is a schematic side cross-sectional view of one example embodiment of the method of filling a portion of the imprinted pattern 58, including impressions 42 and 44, on the substrate 12 of FIG. 1. After the embossing and ash or etch of residual material 14 in the steps of FIG. 1, which are utilized to exposed the metal substrate 12 through the dielectric layer 14 in each of impressions 42 and 44, a conductive material 60, such as metal, is deposited, such as plated, within impressions 42 and 44. This first plating step takes place to at least a depth of lower 48 stop surface such that the lower, narrow portion 62 of second impression 44 is filled with plating material.

Figure 3:
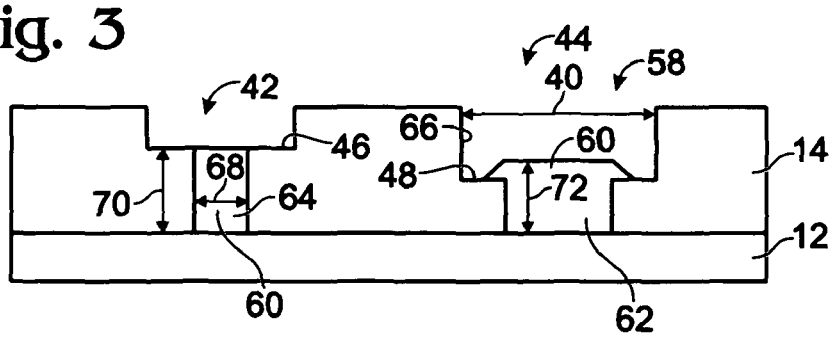
FIG. 3 is a schematic side cross-sectional view of one example embodiment of further filling a portion of the imprinted pattern on the substrate of FIG. 2.

FIG. 3 is a schematic side cross-sectional view of one example embodiment of further filling a portion of the imprinted pattern 58 on the substrate 12 of FIG. 2. As shown in this figure, the first plating step may be continued such that conductive material 60 is plated within impression 44 upwardly past stop surface 48 and completely filling the lower portion 64 of impression 42. At this stage of the plating process, due to the difference in size of cross sectional dimension 40 of the upper portion 66 of impression 44, which is larger than the cross sectional dimension 68 of lower portion 64 of impression 42, first impression 42 is plated to a height 70 slightly higher than a height 72 of second impression 44. Accordingly, the height of the plating in impressions 42 and 44 during the plating step is controlled by the different positions of the stop surfaces 46 and 48 above substrate 12 and by the width of the various regions of impressions 42 and 44.

Figure 4:
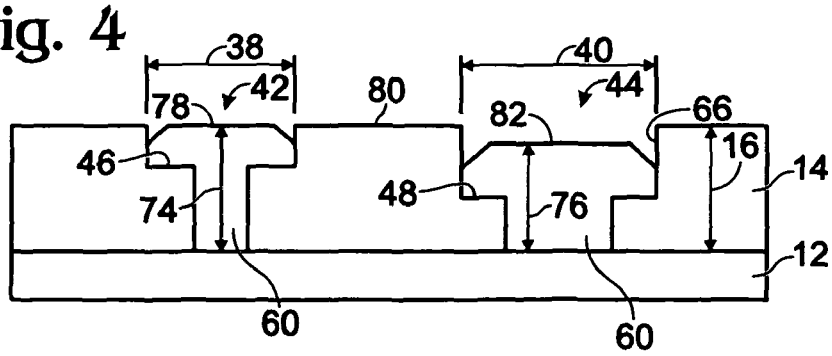
FIG. 4 is a schematic side cross-sectional view of one example embodiment of further filling a portion of the imprinted pattern on the substrate of FIG. 3.

FIG. 4 is a schematic side cross-sectional view of one example embodiment of further filling a portion of the imprinted pattern 58 on the substrate 12 of FIG. 3. As shown in this figure, the first plating step may be continued such that conductive material 60 is plated within impression 44 further upwardly past stop surface 48 and within impression 42 upwardly past stop surface 46. At this stage of the plating process, due to the difference in size of cross sectional dimension 40 of the upper portion 66 of impression 44, which is larger than the cross sectional dimension 38 of first stop surface 46 of impression 42, first impression 42 is plated to a height 74 slightly higher than a height 76 of second impression 44. Accordingly, the height of the plating in impressions 42 and 44 during the plating step is controlled by the different positions of the stop surfaces 46 and 48 above substrate 12 and by the width of the various regions of impressions 42 and 44. At the completion of the plating step, the top surface 78 of conductive material 60 within first impression 42 may be positioned level and aligned with the top surface 80 of layer 14 and the top surface 82 of conductive material 60 within second impression 44 is positioned below top surface 80 of layer 14.

Figure 5:
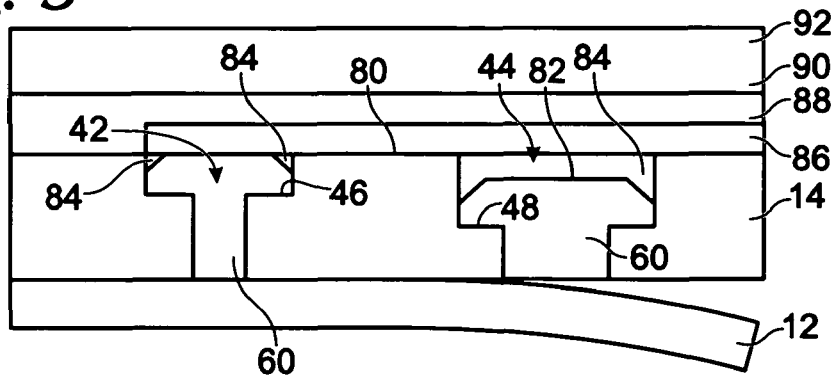
FIG. 5 is a schematic side cross-sectional view of one example embodiment of additional layers positioned on the substrate of FIG. 4.

FIG. 5 is a schematic side cross-sectional view of one example embodiment of additional layers positioned on the substrate 12 of FIG. 4. After the plating step is concluded, a nonconductive material 84, such as a dielectric material, may be formed within impressions 42 and 44 on top of top surface 82 of conductive material 60. The nonconductive material 84 is then ashed or etched so that exposure of the top surface of 42 is complete. This nonconductive material 84 electrically isolates conductive material 60 from a subsequent layer of conductive material 86, such as a crossover metal layer, deposited on top of layer 14 and in electrical contact with conductive material 60 positioned within impression 42. This conductive material layer 86 may be referred to as a contact or crossover conductive line that electrically connects to conductive material 60 within first impression 42. An adhesive layer 88 may be formed on top of conductive layer and a sealing layer 90, such as a MELENEX® (PEN (Polyethylene Naphthalate)) type plastic sheet layer, may be formed on top of adhesive layer 88. After formation of sealing layer 90, the substrate 12 maybe removed from layer 14, such as by peeling or any other method, wherein layer 12 is shown approximately midway during the removal step of peeling substrate 12 from layer 14. This process results in an microelectronic device 92 that is manufactured with at least one less ash step and at least one less plating step as prior art fabrication methods. Moreover, this process results in a device 92 having conductive regions 42 and 44 that are securely anchored within dielectric layer 14 by stop surfaces 46 and 48, respectively, as substrate 12 is peeled from dielectric layer 14.

Figure 6:
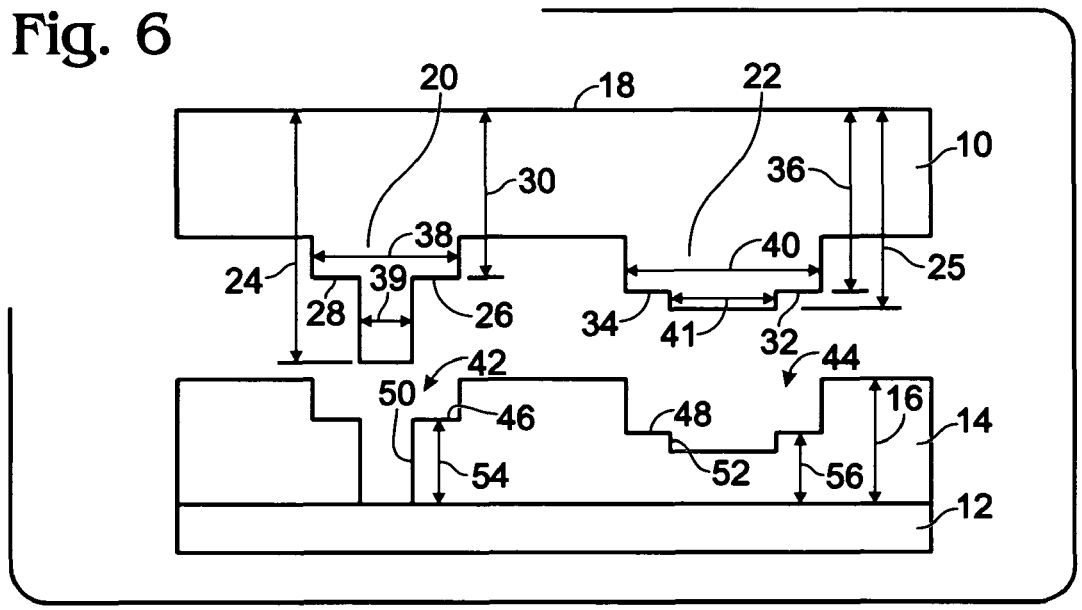
FIG. 6 is a schematic side cross-sectional view of another example embodiment of an embossing stamp positioned over and imprinting a layer on a substrate.

FIG. 6 is a schematic side cross-sectional view of another example embodiment of an embossing stamp positioned over and imprinting a layer on a substrate. In this embodiment, embossing stamp 10 may include a back plane 18, shown in end view, and may include first and second embossing structures 20 and 22 that extend outwardly a first distance 24 and a second distance 25, respectively, from plane 18, wherein first and second distances 24 and 25 each define a different height when measured with respect to plane 18.

Similar to FIG. 1, first embossing structure 20 may further include an anchor structure 26, such as a stop surface, 28, that may extend outwardly from plane 18 a second distance 30. Second embossing structure 22 may further include an anchor structure 32, such as a stop surface 34, that may extend outwardly from plane 18 a third distance 36 that may be different from second distance 30. Stop surface 28 of first embossing structure 20 may define a cross sectional dimension 38 that is different, such as smaller, than a cross sectional dimension 40 of stop surface 34.

Additionally, first embossing structure 20 may define a cross sectional dimension 39 in a lower region that is less than the cross sectional dimension 38 in an upper region of first embossing structure 20. Similarly, second embossing structure 22 may define a cross sectional dimension 41 in a lower region that is less than the cross sectional dimension 40 in an upper region of second embossing structure 22. The upper regions of the embossing structures that define dimensions 38 and 40, respectively, that are greater than the dimensions 39 and 41, respectively, of the lower regions of embossing structures 20 and 22, define the anchor structures in this embodiment.

Due to the difference between second and third distances 30 and 36, when stamp 10 is impressed within dielectric layer 14, impressions 42 and 44 will be formed within dielectric layer 14 by first and second anchor structures 20 and 22, wherein the respective stop surfaces 46 and 48 of anchor structures 50 and 52 of impressions 42 and 44 formed in layer 14, will be positioned at first height 54 and a second height 56, respectively, from substrate 12. This difference in heights 54 and 56 of the stop surfaces 46 and 48 of the impressions 42 and 44, allows for filling of the impressions 42 and 44 in a single process, i.e., metal may be plated in both impressions at the same time, to form electrically conductive structures at different heights within layer 14, as will be discussed in more detail below. In this particular embodiment, second impression 44 does not extend downwardly completely through layer 14 to communicate with substrate 12. Accordingly, in this embodiment, use of embossing stamp 10 may be referred to a dual level embossing process for each feature of the microelectronic device.

Figure 7:
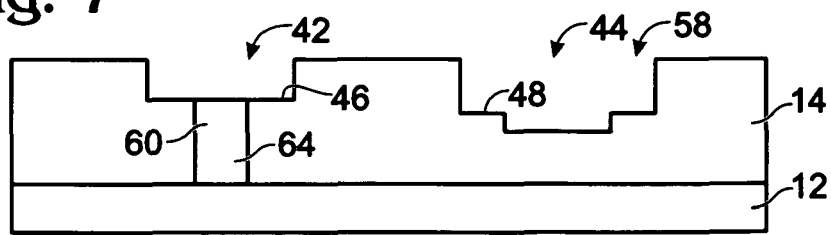
FIG. 7 is a schematic side cross-sectional view of one example embodiment of filling a portion of the imprinted pattern on the substrate of FIG. 6.

FIG. 7 is a schematic side cross-sectional view of one example embodiment of filling a portion of the imprinted pattern 58 on the substrate 12 of FIG. 6. After the embossing and ash or etch steps of FIG. 6, which are utilized to exposed the metal substrate 12 through the dielectric layer 14 in impression 42, a conductive material 60, such as metal, is plated within first impression 42. This first plating step takes place to a depth of lower 46 stop surface, i.e., to the anchor point of the first impression 42, such that the lower, narrow portion 64 of first impression 42 is filled with plating material 60.

Figure 8:
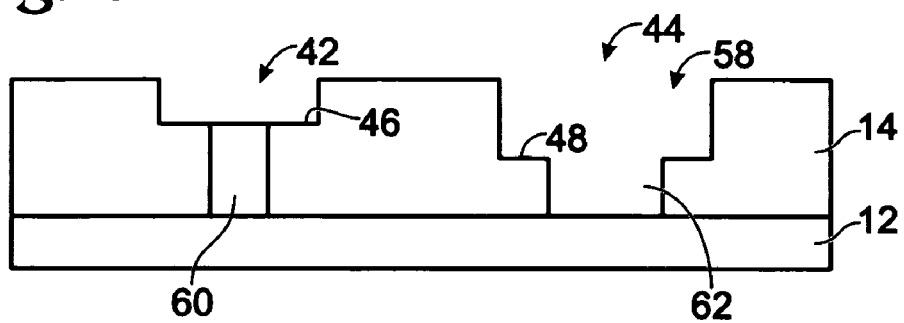
FIG. 8 is a schematic side cross-sectional view of one example embodiment of removing a portion of the imprinted pattern on the substrate of FIG. 7.

FIG. 8 is a schematic side cross-sectional view of one example embodiment of the step of removing a portion of the imprinted pattern 58 on the substrate 12 of FIG. 7. After plating in the first impression 42 in FIG. 7, an ash or etch step is conducted to expose the second level plating surface within second impression 44, such that impression 44 communicates with and extends downwardly to substrate 12 in lower portion 62 of second impression 44.

Figure 9:
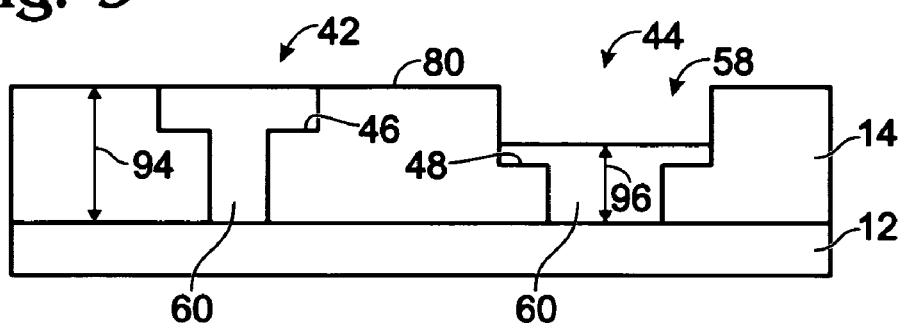
FIG. 9 is a schematic side cross-sectional view of one example embodiment of filling a portion of the imprinted pattern on the substrate of FIG. 8.

FIG. 9 is a schematic side cross-sectional view of one example embodiment of filling a portion of the imprinted pattern 58 on the substrate 12 of FIG. 8. After the ash step of FIG. 8, a second level over plating step is conducted such that first impression 42 is filled completely with conductive material 60 to top surface 80 of layer 14, and to a height 94, and so that second impression 44 is filled with conductive material 60 to a height 96 that is above stop surface 48 but below top surface 80 of layer 14. In this manner, both of stop surfaces 46 and 48 are coated with conductive material 60 and therefore act as anchor structures in impressions 42 and 44 within dielectric layer 14. However, impression 44 is not completely filled so that dielectric material may be deposited and etched to expose the plated metal of impression 42, while the dielectric material electrically isolates conductive material 60 in impression 44 from an overlaying crossover metal layer, as will be discussed with respect to FIG. 10.

Figure 10:
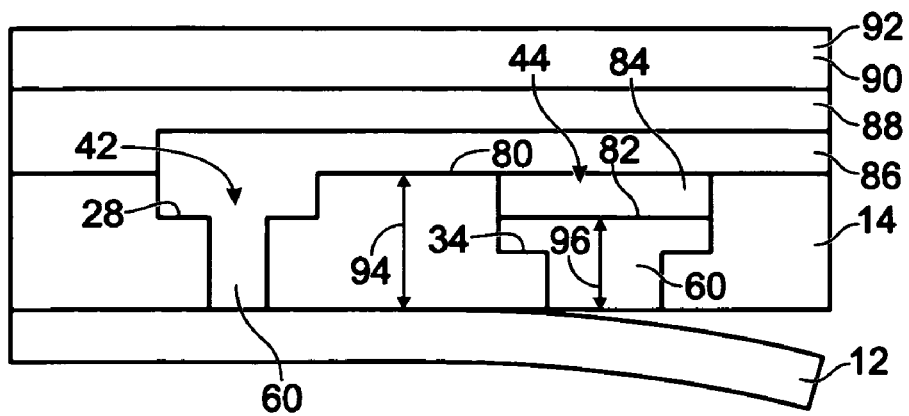
FIG. 10 is a schematic side cross-sectional view of one example embodiment of additional layers positioned on the substrate of FIG. 9.

FIG. 10 is a schematic side cross-sectional view of one example embodiment of additional layers positioned on the substrate 12 of FIG. 9. After the plating step is concluded in FIG. 9, a nonconductive material 84, such as a dielectric material, may be formed within second impression 44 on top of top surface 82 of conductive material 60. This nonconductive material 84 electrically isolates conductive material 60 from a subsequent layer of conductive material 86, such as a crossover metal layer, deposited on top of layer 14 and in electrical contact with conductive material 60 positioned within impression 42 but not in electrical contact with conductive material 60 in second impression 44. This conductive material layer 86 may be referred to as a contact or crossover conductive line that electrically connects to conductive material 60 within first impression 42. An adhesive layer 88 may be formed on top of conductive layer and a sealing layer 90, such as a MELENEX® (PEN (Polyethylene Naphthalate)) type plastic sheet layer, may be formed on top of adhesive layer 88. After formation of sealing layer 90, the substrate 12 may be removed from layer 14, such as by peeling or any other method, wherein layer 12 is shown approximately midway during the removal step of peeling substrate 12 from layer 14. This process results in an microelectronic device 92 that is manufactured with less processing steps than prior art fabrication methods. Moreover, this process results in a device 92 having conductive regions 42 and 44 that are securely anchored within dielectric layer 14 by stop surfaces 28 and 34, respectively, as substrate 12 is peeled from dielectric layer 14.

Figure 11:
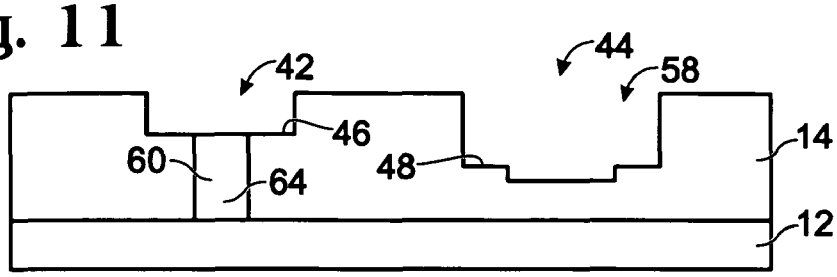
FIG. 11 is a schematic side cross-sectional view of another example embodiment of filling a portion of an imprinted pattern on a substrate.

FIG. 11 is a schematic side cross-sectional view of another example embodiment of filling a portion of an imprinted pattern 58 on a substrate 12. After the embossing and ash or etch steps as described above with respect to a similar embodiment shown in FIG. 6, which are utilized to exposed the metal substrate 12 through the dielectric layer 14 in impression 42, a conductive material 60, such as metal, is plated within first impression 42. This first plating step takes place to a depth of lower 46 stop surface, i.e., to the anchor point of the first impression 42, such that the lower, narrow portion 64 of first impression 42 is filled with plating material 60.

Figure 12:
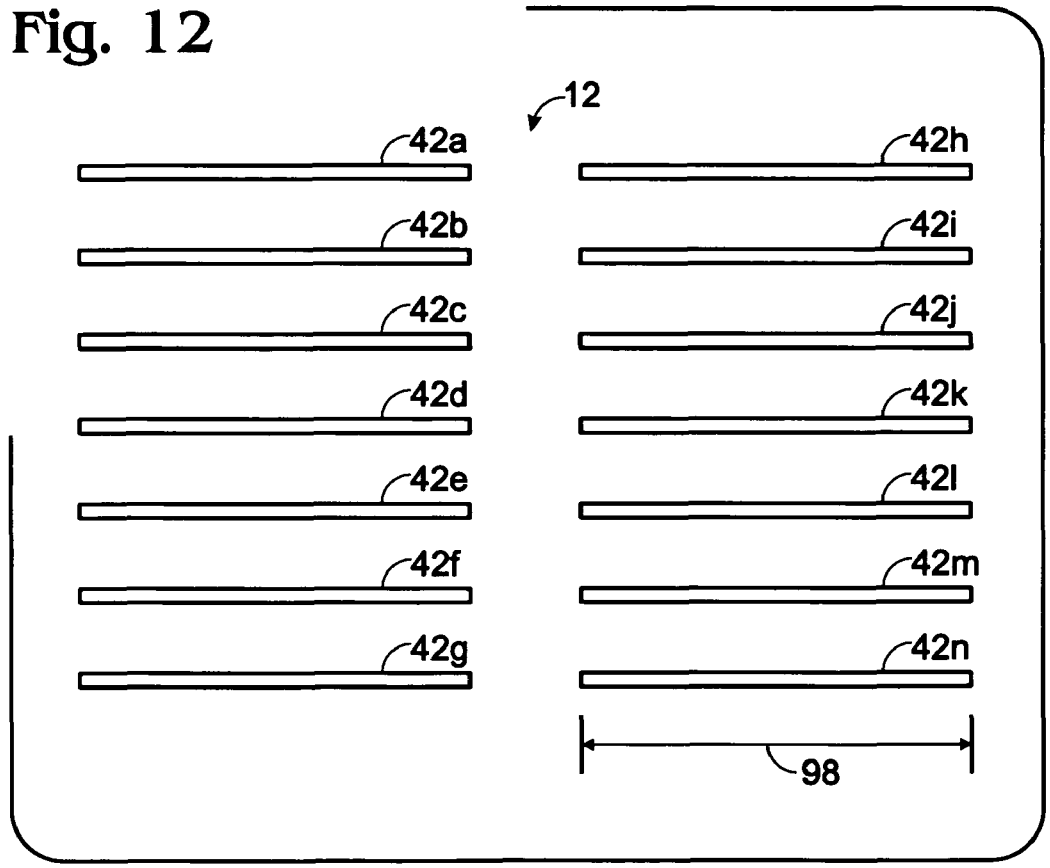
FIG. 12 is a schematic top view of one example embodiment of a via pattern on the substrate of FIG. 11.

FIG. 12 is a schematic top view of one example embodiment of the via pattern 58 on a substrate 12 of FIG. 11, wherein a plurality of first impressions or grooves 42a-42n, for example, are each filled with conductive material 60, and wherein each of the plurality of impressions 42a-42n defines a length 98.

Figure 13:
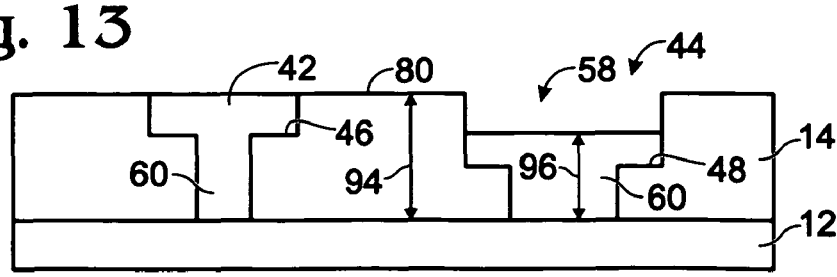
FIG. 13 is a schematic side cross-sectional view of one example embodiment of filling a portion of the imprinted pattern on the substrate of FIG. 11.

FIG. 13 is a schematic side cross-sectional view of one example embodiment of filling a portion of the imprinted pattern 58 on the substrate 12 of FIG. 11. After an ash step wherein the dielectric material in the lower region of second impression 44 is removed, a second level over plating step is conducted such that first impression 42 is filled completely with conductive material 60 to top surface 80 of layer 14, and to a height 94, and so that second impression 44 is filled with conductive material 60 to a height 96 that is above stop surface 48 but below top surface 80 of layer 14. In this manner, both of stop surfaces 46 and 48 are coated with conductive material 60 and therefore act as anchor structures in impressions 42 and 44 within dielectric layer 14, but impression 44 is not completely filled so that dielectric material may be positioned thereon to electrically isolate conductive material 60 in impression 44 from an overlaying crossover metal layer, as will be discussed with respect to FIG. 14.

Figure 14:
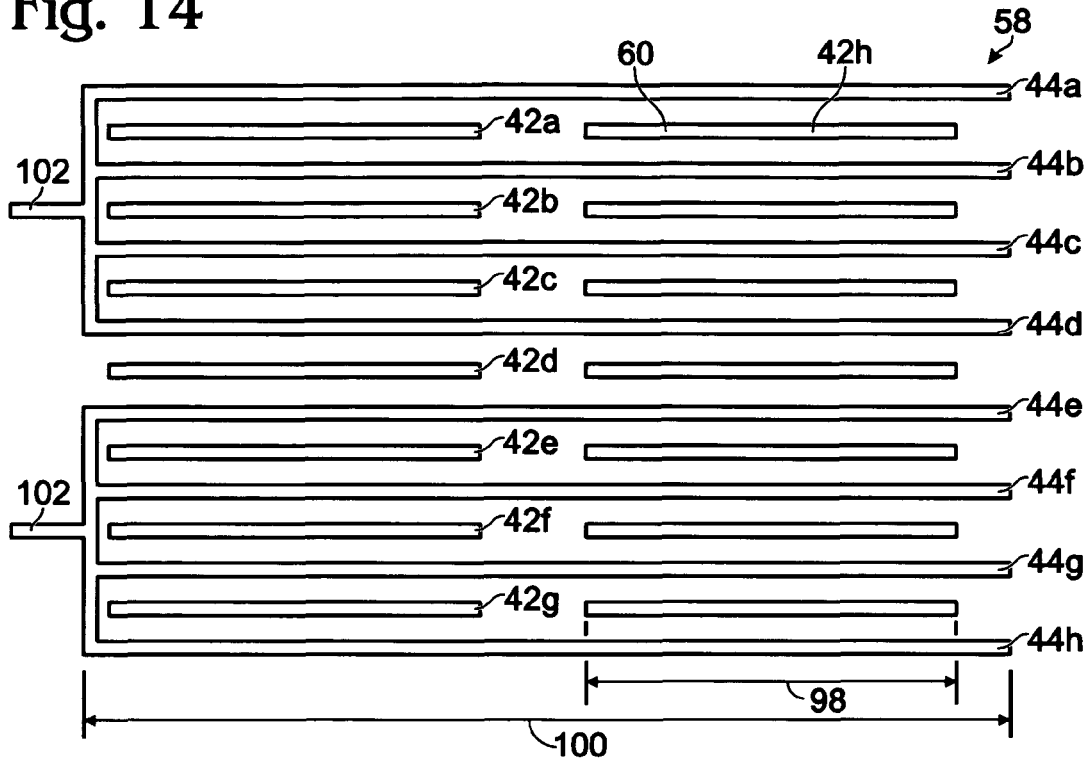
FIG. 14 is a schematic top view of one example embodiment of a via pattern on the substrate of FIG. 13.

FIG. 14 is a schematic top view of one example embodiment of the via pattern 58 on a substrate 12 of FIG. 13, wherein a plurality of second impressions or grooves 44a-44h, for example, are each filled with conductive material 60, and wherein each of the plurality of impressions 44a-44h defines a length 100 and are each connected to a conductive line 102. Impressions 42 are electrically isolated from impressions 44 and conductive lines 102 due to the different heights of the impressions 42 and 44 formed on substrate 12 (FIG. 13). Length 100 of second impressions 44 is more than double the length 98 of first impressions 42 such that second impressions 44 extend along two of first impressions 42 in this particular embodiment. For example, second impression 44a extends the length of both 42a and 42h.

Figure 15:
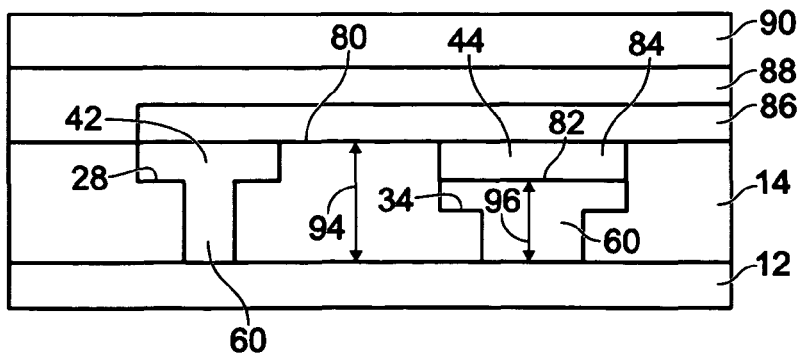
FIG. 15 is a schematic side cross-sectional view of one example embodiment of additional layers positioned on the substrate of FIG. 13.

FIG. 15 is a schematic side cross-sectional view of one example embodiment of additional layers positioned on the substrate 12 of FIG. 13. After the plating step is concluded in FIG. 13, a nonconductive material 84, such as a dielectric material, may be formed over all the structures and then etched to expose conductive material 60 on the top surface of impression 42, while covering the top surface 82 of conductive material 60 in impression 44. This nonconductive material 84 electrically isolates conductive material 60 from a subsequent layer of conductive material 86, such as a crossover metal layer, deposited on top surface 80 of layer 14 and in electrical contact with conductive material 60 positioned within impression 42. This conductive material layer 86 may be referred to as a contact or crossover conductive line that electrically connects to conductive material 60 within first impression 42. An adhesive layer 88 may be formed on top of conductive layer and a sealing layer 90, such as a MELENEX® type plastic sheet layer, may be formed on top of adhesive layer 88.

FIG. 16 is a schematic top view of one example embodiment of the via pattern 58 on a substrate 12 of FIG. 15, wherein a plurality of crossover metal lines 86*a* and 86*b*, for example, have been formed on top surface 80 as shown in FIG. 15. Crossover metal line 86*a* electrically contacts conductive material 60 in each of first impressions 42*a*-42*g* and crossover metal line 86*b* contacts conductive material 60 in each of first impressions 42*h*-42*n*. Crossover metal lines 86*a* and 86*b* do not electrically contact conductive material 60 in second impressions 44*a*-44*h* because the conductive material 60 in second impressions 44*a*-44*h* is electrically isolated from the crossover metal lines 86*a* and 86*b* by dielectric material 84 (FIG. 15). Accordingly, the process disclosed herein includes the formation of crossover metal lines 86 formed in single elongate lines 86*a* and 86*b*, for example, rather than in the discrete crossover connections of the prior art which are time consuming to manufacture and often not located in precisely the correct position. Moreover, the single elongate lines 86*a* and 86*b* of the crossover metal lines of the embodiments disclosed result in a microelectronic device 92 having reduced field effect interference within the device 92 because the distance between lines 42*a*-42*g* and lines 44*a*-44*h* are maximized.

Additionally, still referring to FIG. 16, the formation of crossover metal lines as single elongate lines 86*a* and 86*b*, for example, instead of discrete crossover connections of the prior art, provides a large tolerance for placement of the crossover metal lines on impressions 42. As show in FIG. 16, crossover metal lines 86*a* and 86*b* are each positioned in the far left hand region 106 of first impressions 42*a*-42*g* and 42*h*-42*n*, respectively. This far left hand region placement of crossover metal lines 86*a* and 86*b* is an ideal placement for the crossover metal lines 86. However, the formation of crossover metal lines as single elongate lines 86*a* and 86*b*, instead of discrete crossover connections of the prior art, allows crossover metal lines 86 to be formed at numerous locations along the length 98 of first impressions 42 and still make electrical contact with the conductive material 60 within the particular impression 42, as will be described below with respect to FIG. 17.

FIG. 17 is a schematic top view of another example embodiment of the via pattern 58 on a substrate 12 of FIG. 15, wherein a plurality of crossover metal lines 86*a* and 86*b*, for example, have been formed on top surface 80 as shown in FIG. 15. In this embodiment the crossover metal lines 86*a* and 86*b* are misaligned from a preferred position (FIG. 16) at the far left hand region 106 of impressions 42 by a misalignment distance 104, measured from the far left hand region 106 of impressions 42 such that crossover metal lines 86*a* and 86*b* are positioned in a central region 108 of impressions 42. This central positioning of crossover metal lines 86 may be referred to as a misaligned position, but due to the formation of impressions 42 as an elongate via, crossover metal lines 86 in this embodiment are still functional, i.e., still make electrical contact with conductive material 60 positioned within first impressions 42.

FIG. 18 is a schematic top view of another example embodiment of the via pattern 58 on a substrate 12 of FIG. 15, wherein a plurality of crossover metal lines 86*a*1, 86*a*2 and 86*b*1 and 86*b*2, for example, have been formed on top surface 80 as shown in FIG. 15. In this embodiment the crossover metal lines 86*a*1 and 86*a*2 are both aligned on first impressions 42*a*-42*g* so that both crossover metal lines 86*a*1 and 86*a*2 function to make electrical contact with conductive material 60 within first impressions 42*a*-42*g*. Similarly, crossover metal lines 86*b*1 and 86*b*2 are both aligned on first impressions 42*h*-42*n* so that both crossover metal lines 86*b*1 and 86*b*2 function to make electrical contact with conductive material 60 within first impressions 42*h*-42*n*. Accordingly, in this embodiment fuses 110*a*1 and 110*a*2 will be left intact so that crossover metal lines 86*a*1 and 86*a*2 will be electrically connected to connections pads 112*a*1 and 112*a*2. Similarly, in this embodiment fuses 110*b*1 and 110*b*2 will be left intact so that crossover metal lines 86*b*1 and 86*b*2 will be electrically connected to connections pads 112*b*1 and 112*b*2. In other words, due to the alignment of crossover metal lines 86 on their corresponding impressions 42, fuses 110 are left intact. However, in other embodiments wherein crossover metal lines 86 are misaligned, fuses 110 maybe selectively blown or otherwise rendered inoperable to ensure correct electrical connectivity of device 92 as desired.

FIG. 19 is a schematic top view of another example embodiment of the via pattern 58 on a substrate 12 of FIG. 15, wherein a plurality of crossover metal lines 86*a*1, 86*a*2 and 86*b*1 and 86*b*2, for example, have been formed on top surface 80 as shown in FIG. 15. In this embodiment the crossover metal line 86*a*1 is misaligned on impressions 42 because line 86*a*1 does not electrically contact first impressions 42*a*-42*g*. However, crossover metal line 86*a*2 is correctly aligned on first impressions 42*a*-42*g* so that crossover metal line 86*a*2 functions to make electrical contact with conductive material 60 within first impressions 42*a*-42*g*. Similarly, crossover metal line 86*b*1 is misaligned on impressions 42 because line 86*b*1 does not electrically contact first impressions 42*h*-42*n* but instead contacts first impressions 42*a*-42*g*. However, crossover metal line 86*b*2 is correctly aligned on first impressions 42*h*-42*n* so that crossover metal line 86*b*2 functions to make electrical contact with conductive material 60 within first impressions 42*h*-42*n*. Accordingly, in this embodiment fuse 110*a*2 and fuse 110*b*2 will be left intact so that crossover metal lines 86*a*2 and 86*b*2 will be electrically connected to connections pads 112*a*2 and 112*b*2, respectively. However, fuse 110*b*1 will be blown or otherwise disabled, so that crossover metal line 86*b*1 will be electrically disconnected to connection pad 112*b*2. In this embodiment fuse 110*a*1 may not be blown or otherwise disabled because crossover metal line 86*a*1 lies on conductive line 102 but is not electrically connected to conductive line 102 due to the presence of intermediate dielectric layer 84 (FIG. 15) between the conductive material 60 and conductive metal line 102. In other words, due to the misalignment of a crossover metal line 86 on its corresponding impressions 42, certain fuses 110 may be disabled to ensure proper electrical connectivity of device 92 as desired.

Accordingly, due to the elongate shape of first impressions 42, due to the elongate shape of crossover metal lines 86, and due to the differing heights of conductive material 60 within the impressions, large misalignment tolerances are allowed during fabrication of electrical device 92. Additionally, due to the elongate shape of first impressions 42, due to the elongate shape of crossover metal lines 86, and due to the differing heights of conductive material 60 within the impressions, very large misalignment, which results in undesirable electrical connections in device 92, may be eliminated during fabrication of electrical device 92 by selective destruction of fuses 110 formed in device 92. Such destruction of fuses 110 as desired may be accomplished by any means, such as by laser irradiation of the particular fuse. The above described embodiments and fabrication steps, therefore, provide for increased reliability of alignment of crossover metal connectors, and provide for decreased damage to the conductors during removal of the substrate from the device.

Figure 20:
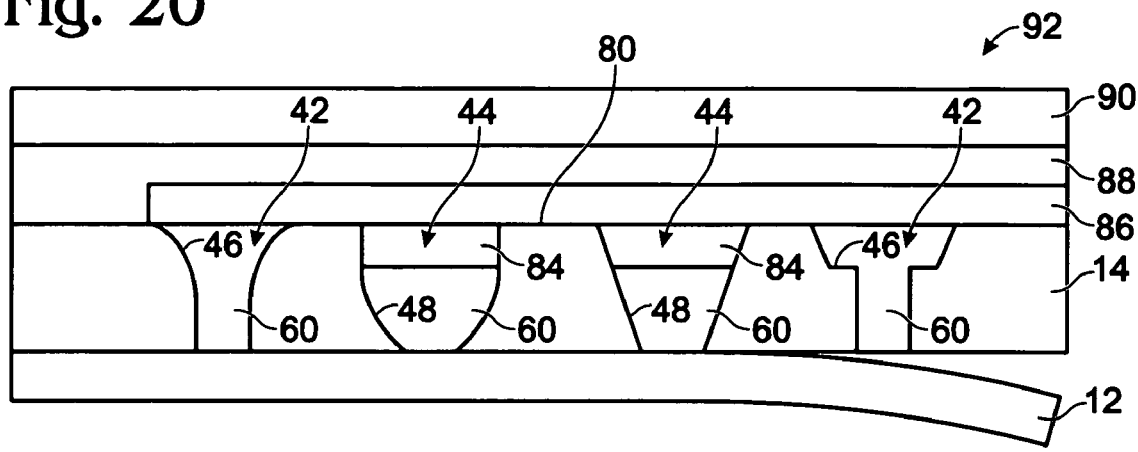
FIG. 20 is schematic side cross-sectional view showing different shapes of anchor structures within a microelectronic device.

FIG. 20 is schematic side cross-sectional view showing different shapes of anchor structures within a microelectronic device 92.

Other variations and modifications of the concepts described herein may be utilized and fall within the scope of the claims below.

I claim:

1. A microelectronic device comprising:
a dielectric layer that includes a front surface that defines a front plane and a rear surface that defines a rear plane;
a first conductive structure positioned within said dielectric layer and including a first exposed surface positioned in said front plane, said first conductive structure further comprising a first anchor structure positioned rearwardly from said front plane, said first anchor structure defining a cross sectional dimension greater than a cross sectional dimension of said first exposed surface of said first conductive structure, and a back surface of said first anchor structure positioned completely forwardly of said rear plane and a nonconductive material between said back surface of said first anchor structure and said rear plane electrically isolating said first conductive structure from said rear plane of said dielectric layer; and
a second conductive structure positioned within said dielectric layer and including a second exposed surface positioned in said front plane, said second conductive structure further comprising a second anchor structure positioned rearwardly from said front plane, said second anchor structure defining a cross sectional dimension greater than a cross sectional dimension of said second exposed surface of said second conductive structure, and said second anchor structure of said second conductive structure electrically exposed on said rear surface of said dielectric layer.

2. The device of claim 1 wherein a first stop surface of said first anchor structure of said first conductive structure is positioned rearwardly a first distance from said front plane, and said wherein a second stop surface of said second anchor structure of said second conductive structure is positioned rearwardly a second distance from said front plane, the second distance is different from said first distance.

3. The device of claim 2 wherein said first anchor structure of said first conductive structure defines a cross sectional surface area greater than a cross sectional surface area of said first exposed surface of said first conductive structure, and wherein said second anchor structure of said second conductive structure defines a cross sectional surface area greater than a cross sectional surface area of said second exposed surface of said second conductive structure.

4. The device of claim 2 wherein said first conductive structure defines a first elongate conductor and wherein said second conductive structure defines a second elongate conductor positioned parallel to said first elongate conductor.

5. The device of claim 4 wherein said first elongate conductor defines a plurality of parallel, elongate first conductors and wherein said second elongate conductor defines a plurality of parallel, elongate second conductors alternatingly positioned between ones of said plurality of parallel, elongate first conductors of said first conductive structure forming rows of said plurality of parallel, elongate second conductors.

6. The device of claim 5 wherein said plurality of parallel, elongate second conductors defines multiple columns of said plurality of parallel, elongate second conductors.

7. The device of claim 6 further comprising a third conductive structure including a plurality of parallel, elongate third conductors positioned perpendicular to said plurality of parallel, elongate first conductors of said first conductive structure and said plurality of parallel, elongate second conductors of said second conductive structure.

8. The device of claim 7 wherein individual ones of said plurality of elongate third conductors of said third conductive structure electrically contacts each of said plurality of parallel, elongate second conductors of a respective column of said multiple columns of said plurality of parallel, elongate second conductors of said second conductive structure on said rear surface of said dielectric layer and is electrically isolated from said plurality of parallel, elongate first conductors of said first conductive structure.

9. The device of claim 8 wherein said third conductive structure includes fuses, each of said fuses being between each of said plurality of parallel, elongate third conductors, wherein selective ones of said fuses are disabled such that said respective column of said multiple columns of said second conductive structure is electrically connected to only a single elongate conductor of said plurality of parallel, elongate third conductors of said third conductive structure.

10. The device of claim 1 wherein said first anchor structure of said first conductive structure and said second anchor structure of said second conductive structure are each chosen from a group consisting of a shoulder positioned parallel to said front plane, a tapered surface inclined with respect to said front plane, and a surface that defines an arc with respect to said front plane.

11. A microelectronic device comprising:
a dielectric layer that includes a front surface that defines a front plane and a rear surface that defines a rear plane;
a first elongate conductive structure positioned completely within said dielectric layer and including a first front exposed surface positioned in said front plane and a back surface positioned forwardly of said rear plane and a nonconductive material between said back surface of said first elongate conductive structure and said rear plane electrically isolating said first elongate conductive structure from said rear plane of said dielectric layer, the first elongate conductive structure and said nonconductive material having a first cross sectional surface area; and
a second elongate conductive structure positioned parallel to said first elongate conductive structure and completely within said dielectric layer and including a second front, exposed surface positioned in said front plane and a back surface positioned within said rear plane of said rear surface of said dielectric layer, the second elongate conductive structure having a second cross sectional surface area less than a cross sectional surface area of said first cross sectional surface area.

12. The device of claim 11 further comprising a elongate conductive structure positioned on said rear surface of said dielectric layer and electrically contacting said second elongate conductive structure and electrically isolated from said first elongate conductive structure.

13. The device of claim 12 wherein said third elongate conductive structure is positioned perpendicular to said second elongate conductive structure and wherein said first elongate conductive structure comprises multiple parallel, elongate first conductive lines, wherein said second elongate conductive structure comprises multiple, parallel, elongate second conductive lines, and wherein said third elongate conductive structure electrically contacts said multiple, parallel elongate second conductive lines of said second elongate conductive structure and is electrically isolated from said multiple, parallel, elongate first conductive lines of said first elongate conductive structure.

14. The device of claim 13 wherein said second elongate conductive structure comprises multiple columns of said multiple, parallel, elongate second conductive lines, and wherein said third elongate conductive structure includes a base region and multiple contact portions extending outwardly from said base region, wherein said multiple contact portions of said third elongate conductive structure are each positioned perpendicular to and electrically connected to ones of said multiple columns of said second elongate conductive structure and wherein said base portion defines an elongate region including a fuse positioned between each of said multiple contact portions and wherein individual ones of said fuses may be disabled such that individual ones of said multiple columns of said second elongate conductive structure are electrically contacted by only a single elongate contact portion of said multiple contact portions of said third elongate conductive structure.

15. The device of claim 12 wherein said third elongate conductive structure electrically contacts said second elongate conductive structure by contact with said second elongate conductive structure at any position along a length of said second elongate conductive structure and wherein said third elongate conductive structure is formed in a plane different from a plane of said first elongate conductive structure.

16. A method of manufacturing a microelectronic device, comprising:
    imprinting a layer on a substrate with an imprinted pattern;
    a first imprint of said imprinted pattern defining a first anchor impression within said layer that includes a first base region positioned in a lower portion of said layer and a first distal region positioned above said first base region, said first distal region defining a cross sectional area greater than a cross sectional area of said first base region;
    a second imprint of said imprinted pattern defining a second anchor impression within said layer that includes a second base region positioned in a lower portion of said layer and a second distal region positioned above said second base region, said second distal region defining a cross sectional area greater than a cross sectional area of said second base region and greater than a cross sectional area of said first distal region;
    depositing a first conductive material within said first anchor impression to a first height measured from said substrate;
    depositing a second conductive material within said second anchor impression to a second height measured from said substrate, wherein said second height is less than said first height;
    depositing a non-conductive material within said second anchor impression on said second conductive material, so that said second conductive material within said second distal region of said second anchor impression is electrically isolated from a top plane of said layer; and
    depositing a third conductive material on said layer, said third conductive material electrically contacting said first conductive material in said first anchor impression and electrically isolated from said second conductive material in said second anchor impression.

17. The method of claim 16 wherein said imprinting the layer on the substrate is conducted with an embossing device including a first embossing structure for forming the first imprint of said first anchor impression and a second embossing structure for forming the second imprint of said second anchor impression.

18. The method of claim 16, further comprising:
    removing said substrate from said layer such that said first base region of said first anchor impression is exposed and such that said second base region of said second anchor impression is exposed.

* * * * *